United States Patent [19]

Conzelmann et al.

[11] Patent Number: 4,689,711
[45] Date of Patent: Aug. 25, 1987

[54] MONOLITHICALLY INTEGRATED, POLARITY-REVERSAL PROTECTED CIRCUIT

[75] Inventors: Gerhard Conzelmann, Leinfelden-Echterdingen; Karl Nagel, Gomaringen, both of Fed. Rep. of Germany

[73] Assignee: Robert Bosch GmbH, Stuttgart, Fed. Rep. of Germany

[21] Appl. No.: 797,144

[22] Filed: Nov. 4, 1985

[30] Foreign Application Priority Data

Nov. 30, 1984 [DE]  Fed. Rep. of Germany ....... 3443770

[51] Int. Cl.$^4$ .............................................. H02H 3/20
[52] U.S. Cl. ...................................... 361/91; 361/56;
361/86; 307/127; 330/207 P; 330/298
[58] Field of Search ....................... 361/56, 84, 86, 88,
361/91; 307/252 C, 252 M, 544, 127; 330/207
P, 298; 357/28, 386

[56] References Cited

U.S. PATENT DOCUMENTS

| | | | |
|---|---|---|---|
| 3,748,569 | 7/1973 | Frank et al. | 361/91 X |
| 4,194,134 | 3/1980 | Bjorklund et al. | 361/91 X |
| 4,400,711 | 8/1983 | Avery | 361/56 X |
| 4,499,673 | 2/1985 | Garrett et al. | 361/56 |
| 4,567,580 | 1/1986 | Avery | 361/56 X |
| 4,581,542 | 4/1986 | Steigerwald | 307/305 X |
| 4,581,543 | 4/1986 | Herberg | 357/38 X |
| 4,595,941 | 6/1986 | Avery | 361/91 X |

FOREIGN PATENT DOCUMENTS 41788  3/1980  Japan ................................. 357/386

Primary Examiner—A. D. Pellinen
Assistant Examiner—Derek S. Jennings
Attorney, Agent, or Firm—Michael J. Striker

[57] ABSTRACT

A monolithically integrated, polarity-reversal protected switching circuit includes, in the output of a switching stage, a symmetrical thyristor instead of an otherwise customary diode. This thyristor is constituted by an npn transistor and a lateral pnp transistor. The control input of the thyristor is controlled by an additional control arrangement in such a manner that the thyristor is switched off at the occurrence of high voltage peaks. In this manner, there is obtained a relatively inexpensive monolithically integrated switching arrangement which is protected against polarity reversal and withstands voltage pulses of up to 150 volts.

2 Claims, 5 Drawing Figures

MONOLITHICALLY INTEGRATED, POLARITY-REVERSAL PROTECTED CIRCUIT

BACKGROUND OF THE INVENTION

The present invention relates to electronic control circuits in general, and more particularly to a monolithically integrated, polarity-reversal protected circuit including at least one transistor stage for switching a resistive load on and off.

There are already known polarity-reversal protected circuits which incorporate a switching transistor and a diode included in the output of the switching transistor. The base of the switching transistor is connected with a control circuit which opens and closes the switching transistor, depending on the requirements. The collector-emitter path of the switching transistor and the diode connect the respective output or connecting terminals which are also connected with one another, for instance by a series connection of an incadescent light bulb and a battery. If the polarity of the battery is inadvertently revesed in this known construction, the diode arranged in the output of the switching transistor becomes non-conductive. Now, if this diode were implemented in a monolithically integrated circuit as a collector-base diode, then a maximum voltage corresponding to the collector-base breakdown voltage could be blocked with this diode. In the event, however, that the battery is connected with correct polarity and the switching transistor is blocked or rendered non-conductive, only a maximum voltage corresponding to the collector-emitter breakdown voltage of the switching transitor can be blocked by this circuit arrangement, and it is well known that this collector-emitter breakdown voltage of the switching transistor is considerably lower than the collector-base breakdown voltage. There are presently not known any monolithically integrated transistor switching stages,especially for the use in motor vehicles where high voltage peaks can occur in the on-board network, which would be securely protected both against high voltage pulses and polarity reversal.

SUMMARY OF THE INVENTION

Accordingly, it is a general object of the present invention to avoid the disadvantages of the prior art.

More particularly, it is an object of the present invention to provide a switching circuit for switching a resistive load on and off, which circuit does not posses the drawbacks of the known circuits of this type.

Still another object of the present invention is to so construct the circuit of the type here under consideration as to be able to implement the same in a monolithically integrated form at a relatively low cost.

It is yet another object of the present invention so to design the circuit of the above type as to be able to protect both against polarity reversal and excessive voltage excursions.

A concomitant object of the present invention is to develop a monolithically integrated polarity-reversal protected switching transistor arrangement of the above type which is relatively simple in construction, inexpensive to manufacture, easy to use, and reliable in operation nevertheless.

An additional object of the present invention is to devise an arrangement of the above type which is capable of protecting against much higher voltage excursions than heretofore known arrangements of this type.

In pursuance of these objects and others which will become apparent hereafter, one feature of the present invention resides in a monolithically integrated, polarity-reversal protected circuit for switching a resistive load on and off, this circuit comprising a transistor switching stage having an output; a symmetrical thyristor interposed in the output, including a vertical npn transistor and a lateral pnp transistor, and having a control input and control means connected to the control input and operative for controlling the switching of the thyristor between and the maintenance thereof in its conductive and non-conductive states.

A particular advantage of the arrangement of the present invention as described so far is that the transistor switch ing stage can be constructed in a cost-effective manner as a monolithically integrated circuitry which is safely protected against high voltage peaks or excursions and against polarity reversal. As a result of the use of a symmetrical thyristor instead of the customary diode in the output of the switching transistor, it is possible to block considerably higher voltages than before, which voltages may amount to in excess of 140 V.

It is particularly advantageous when, in accordance with another facet of the present invention, the transistors have respective emitters, collectors and bases, and when the collector of the vertical npn transistor is constituted by the same diffusion zone as the base of the lateral pnp transistor. When this technology is being used, then the blocking voltage, that is, the breakdown voltage between the collector depression and the substrate, is considerably higher than the collector-base breakdown voltage. The control terminal or input of the thyristor is connected with control means which are operative for rendering the thyristor nonconductive at the occurrences of excessive voltages. In the event of polarity reversal, the emitter-base diode of the lateral pnp transistor that constitutes a part of the thyristor performs a blocking function.

An advantageous construction of the arrangement or circuit of the present invention is obtained when the circuit further comprises a first and a second connecting terminal, the first connecting terminal being at a positive potential with respect to the second terminal under normal circumstances, when the transistor switching stage includes at least one switching transistor having an emitter connected with the second terminal, a collector and a base; and when the control means includes a pnp control transistor having an emitter connected with the control input, a collector connected with the collector of the switching transistor, and a base, the control means further including at least one Zener diode connected between the base of the control transistor and the emitter of the switching transistor, a resistor connected between the base of the control transistor and the control input, and a further resitor connected between the control input and the first connecting terminal.

According to a further advantageous aspect of the present invention, the transistor switching stage includes an additional switching transistor connected with the switching transistor in a Darlington circuit arrangement and also having a respective emitter, collector and a base, and the control means further includes an additional Zener diode arranged in series with the Zener diode between the base of the control transistor and the second connecting terminal, two auxiliary transistors having respective collectors each connected with the base of one of the switching transistors, respective emitters connected to the second connecting terminal, and respective bases, two base-control resistors each connected between the juncture of the Zener diodes and the base of a different one of the auxiliary transistors, and an additional resistor interposed between the second connecting terminal and one terminal of the respective base-control resistor.

A particular advantage of this arrangement which includes the two serially arranged Zener diodes and further transistors is that it accomplishes short-circuiting the base-emitter paths in the transistor switching stage and in the thyristor at the occurrence of excessive voltages. All of the switching elements can be monolithically integrated by resorting to simple planar processes, so that there is obtained a space-saving and inexpensively manufacturable switching circuitry.

The novel features which are considered as characteristic of the invention are set forth in particular in the appended claims. The improved switching circuitry itself, however, both as to its construction and its mode of operation, together with additional features and advantages thereof, will be best understood upon perusal of the following detailed description of certain specific embodiments with reference to the accompanying drawing.

DETAILED DESCRIPTION OF THE PREFERRED EMBODIMENTS

Figure 1:
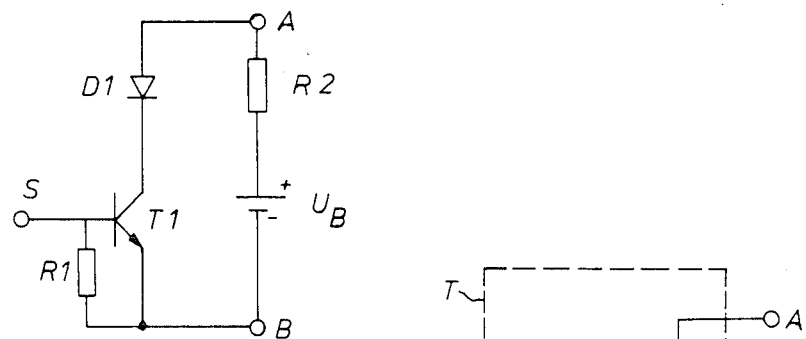
FIG. 1 is a circuit diagram of a known switching circuit arrangement with polarity-reversal protection.

Referring now to the drawing in detail, and first to FIG. 1 thereof, it may be seen that it depicts a circuit diagram of a known transistor switching arrangement which employs an npn transistor T1 as a switching stage. The transistor T1 has a collector which is connected with a cathode of a diode D1. An anode of the diode D1 is connected to an output terminal A. An emitter of the transistor T1 is connected with a second output terminal B which is additionally connected, via a resistor R1, with a base of the transistor T1. The base connection of the transistor T1 constitutes a control input S by means of which the transistor T1 can be rendered conductive or non-conductive by applying an appropriate voltage to the control input S.

A series connection consisting of a load resistor R2 and a battery $U_B$ is arranged between and connected to the output terminals A and B. If the terminals A and B were mistakenly switched during the connection of the aforementioned series connection, so that a more negative potential would be applied to the connecting terminal A than to the connecting terminal B, the diode D1 would become non-conductive or blocking. In a monolithically integrated circuit, the diode D1 would be constituted by a collector-base diode, so that a voltage of about 100 V corresponding to the collector-base breakdown voltage would be blockable. On the other hand, when the connecting terminal A is positive relative to the connecting terminal B, as it is in the situation depicted in FIG. 1, then the transistor T1 in its shut-off or non-conductive condition or state is capable of blocking only a maximum voltage corresponding to the collector-emitter breakdown voltage which is, as is well known, considerably lower than the collector-base breakdown voltage. The collector-emitter breakdown voltage is approximately situated at 40 V.

Figure 2:
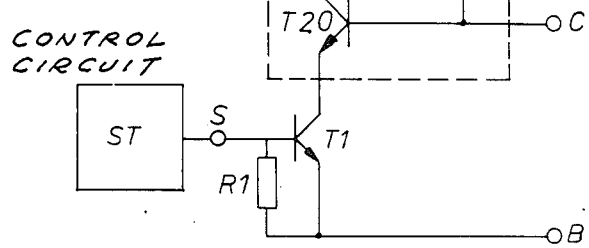
FIG. 2 is a circuit diagram of a switching circuit arrangement according to the present invention.

In order to substantially increase the limiting values of the above-discussed blocking voltages, a symmetrical thyristor T is used instead of the diode D1 in the switching circuit arrangement according to the present invention as it is depicted in FIG. 2 of the drawing. The thyristor T is constituted by an npn transistor T20 and a lateral pnp transistor T21. Herein, the emitter of the npn transistor T20 is connected with the collector of the switching transitor T1, while the emitter of the pnp transistor T21 is connected with the connecting terminal A. The base of the transistor T20 is connected with the collector of the transistor T21 and constitutes a control input or electrode which is connected with a control terminal C. The collector of the transistor T20 is connected with the base of the transistor T21.

This circuit diagram for the thyristor T directly corresponds to the implementation of a thyristor in a monolithically integrated technology. What is important in this connection is that the transistor T21 is constructed symmetrically. This means that its p-n transition between the emitter and the base blocks approximately the same voltage as its transition between the collector and the base. Therefore, the emitter and the collector of the transistor T21 are formed by the base diffusion of the transistor T20.

A control circuit ST, which is connected with the control input S, constitutes a circuitry which is in itself well known and is operative for controlling the operation of the switching transistor T1, so that this control circuit need not be, nor will it be, described in any more detail here.

Figure 3:
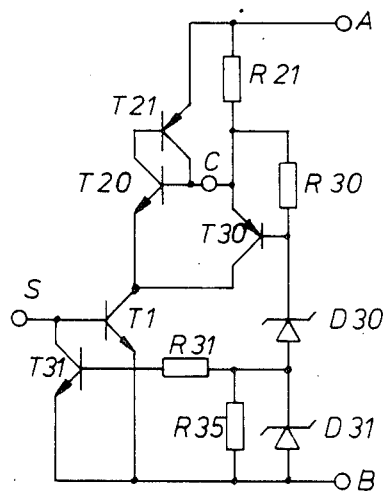
FIG. 3 is a view similar to that of FIG. 2 but showing a modification and expansion of the switching circuit arrangement of the present invention.

The switching arrangement depicted in FIG. 3 is augmented with respect to that of FIG. 2 by the provision of switching means which, generally speaking, is operative for controlling the operation of the control electrode of the thyristor T via the control terminal C. In addition thereto, there is provided an additional transistor T31 which becomes open or conductive in response to the occurrence of excessive voltages at the output and thus blocks the switching transistor T1. More particularly, during the occurrence of excessive output voltages, a diode D30 opens, so that a positive voltage is applied to a resistor 35, this positive voltage then opening the transistor T31 via a resistor R31. The other circuit elements present in the circuit diagram of FIG. 3 and their functions and operations will be discussed below in conjunction with FIG. 4.

Figure 4:
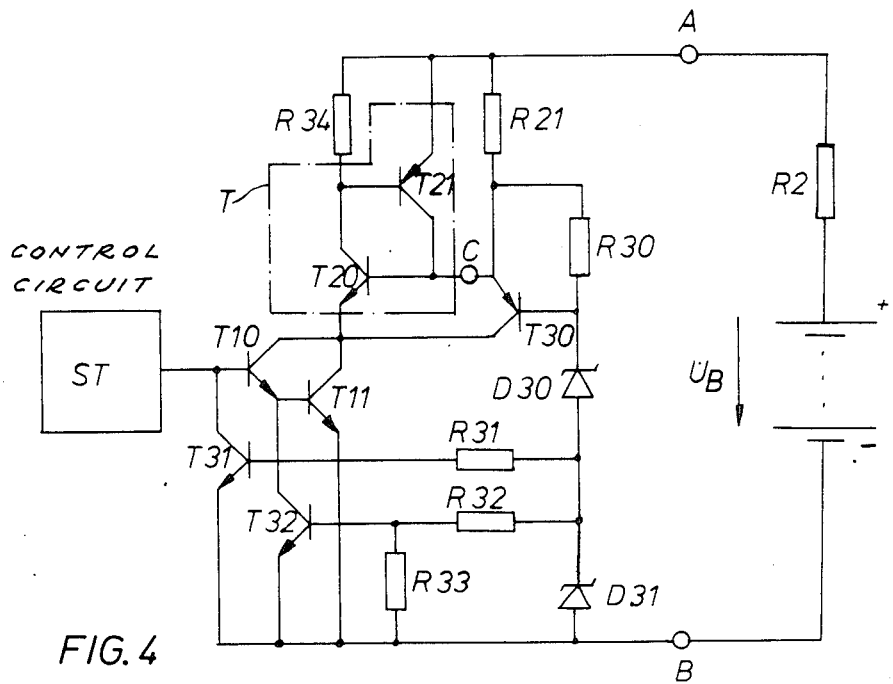
FIG. 4 is a view similar to that of FIG. 3 but showing a further modification and expansion of the switching circuit arrangement which employs a Darlington circuit arrangement for the transistor switching stage.

The circuit arrangement of the present invention as illustrated in FIG. 4 of the drawing constitutes a currently preferred embodiment of the present invention. Pulse-shaped voltages of both polarities in the range of in excess of 140 V can be blocked without encountering any problems when using this circuitry. Herein, a Darlington circuit arrangement of two transistors T10 and T11 is being used as the switching stage, instead of the above-mentioned single switching transistor T1. The base of the transistor T10 is connected to the control circuit ST. The base-emitter resistor Rl of FIGS. 1 and 2 is here replaced by two transistors T31 and T32. In the normal operating voltage range of this circuitry, these two transistors T31 and T32 do not conduct any currents, so that a small current of the control arrangement ST is sufficient to bring the transistors T10 and T11 into their saturated states. The aforementioned thyristor T constituted by the two transistors T20 and T21 is arranged between the common collector of this Darlington circuit arrangement and the connecting terminal A. The control electrode or input of the thyristor T is connected, via a resitor R21, with the connecting terminal A. The plus terminal of the voltage source $U_B$ is connected via the load resistance R2 which represents, for instance, an incadescent light bulb, to the connecting terminal A. The minus terminal of the voltage source $U_B$ is connected with the other connecting terminal B.

The other switching components and connections there of are needed in order to interrupt the flow of the current through the switching circuit arrangement at the occurrence of excessive voltage and to put the circuit arrangement situated between the connecting terminals A and B into a "highly blocking" state. To this end, the control terminal C is connected, via a resistor 30, a Zener diode D30 and a series connected further Zener diode D31 with the connecting terminal B. Both Zener diodes are connected in reverse direction with respect to the battery $U_B$. The juncture of the resistor R30 with the Zener diode D30 is coupled with the base of a further pnp transistor T30, the emitter of which is connected with the control terminal C and the collector of which is connected with the emitter of the transistor T20. The juncture of the two Zener diodes D30 and D31 is connected, on the one hand, via a further resistor R32 to the base of a transistor T31 and, on the other hand, via an additional resistor R32 to the base of the transistor T32, the base of which is simultaneously connected via a resistor R33 with the connecting terminal B. The collector of the transistor T32 is connected with the emitter of the transistor T10 and the emitter of the transistor T32 is connected with the connecting terminal B. Additionally, a resistor R34 is coupled between the base and the emitter of the transistor T21, in order to prevent the possibility that the thyristor T20, T21 could be triggered into its conductive state by the currents flowing out of the base of the transistor T21. These currents could come into existence as a result of the presence of parasitic capacitances at the occurrence of voltage leading edges with high change velocities.

In the normal operating voltage range of the voltage source $U_B$, the switching circuit arrangement according to FIG. 4 functions in the following manner:

It will be initially assumed that the control circuit or switching arrangement ST supplies no current to the base of the transistor T10, so that this transistor T10 and the transistor T11 remain in their current-free condition. As a result of this, the entire switching circuit remains current-free, so that no current flows through the resistive load of load resistor R2. Thus, an incadescent light bulb which may be, for instance, used as the resistive load R2, remains dark. However, if the control circuit ST supplies a sufficiently large current to the base of the Darlington circuit T10 and T11, the latter is brought into its saturated condition or state. Electric current flows from the plus terminal of the battery $U_B$ initially through the resistors R2 and R21 to the control terminal C of the thyristor T that is constituted by the two transistors T20 and T21. The transistor T20 is thus brought into its conductive state and the thyristor T is triggered into its conductive state or fired. The regular operating current flows through the load resistor or resistive load R2, so that the incadescent light bulb used as the resistive load R2 is lit. Now, when the input current of the Darlington circuit T10 and T11 is switched off by the control arrangement ST, the Darlingtom circuit T10 and T11 again becomes current-free and the incadescent light bulb is extinguished.

At the occurrence of an excessive voltage, the switch ing off occurs in the switching arrangement of FIG. 4 as follows:

Under normal circumstances, the connecting terminal A is at a more positive electrical potential than the connecting terminal B. If the battery voltage $U_B$ increases beyond the normal operating voltage range, the operating current through the resistive load R2 increases as well, so that the Darlington circuit T10 and T11 is brought out of its saturated state. From this point on, the voltage between the collector of the transistor T10 and the connecting terminal B increases further with increasing operating voltage. When the potential at such collector reaches a level which corresponds to the breakdown voltage of the Zener diode 30, electric current flows from the connecting terminal A through the resistors R21 and R30 and through the Zener diode 30 and through the resistor R31 and through the emitter-base path of the transistor T31 to the connecting terminal B. The transistor T31 becomes conductive and is brought into its saturated state and thus draws the control current from the transistor T10. The Darlington circuit T10 and T11 and the thyristor T thus become current-free. Now, if the voltage continues to rise, control current also flows through the base of the transistor T32 to the emitter, so that even the transistor T32 is brought into its saturated state and connects the base of the transistor T11 in a low-ohmic manner with its emitter. The pnp transistor T30 also becomes conductive and connects the control input or electrode of the thyristor T in a low-ohmic manner with the emitter of the transistor T20. In this manner, the basis of all of the strongly amplifying transistors T10, T11 and T20 is connected in an extremely low-ohmic manner with its emitter. These transistors T10, T11 and T21 reach their maximum possible blocking voltage. In the lateral transistor T21, the base and the emitter are connected with one another by the resisitor R34. However, an additional lateral transistor could be used instead of the resistor R34, the base of which additional lateral transistor would then be connected through a resistor with a suitable dividing point of the resistive path R21, R30.

The maximum possible collector-emitter voltage at the Darlington circuit T10 and T11 is limited to a value which is constituted by the sum of the breakdown voltages of the Zener diodes D30 and D31. If this switching arrangement is constructed or implemented as a monolithically integrated arrangement, then the breakdown voltage of the Zener diode D30 could be made approximately equal to the collector-emitter breakdown voltage of the Darlington circuit arrangement T10 and T11 or lower. For the breakdown voltage of the Zener diode D31, it is valid that the sum of the breakdown voltages of the two Zener diodes D30 and D31 must always be safely located below the collector-base breakdown voltage of the Darlington circuit arrangement T10 and T11.

Thus, excessive voltages upto the vicinity of the double value of the collector-base breakdown voltage of a transistor can be handled or blocked by the switching arrangement that is illustrated in FIG. 4. Depending on the requirements for the blocking strength and change speed of the voltage leading edge, this switching arrangement can be simplified. So, for instance, the transistor T32 and the resistors R32 and R33 can be replaced by a simple resistor arranged between the base and the emitter of the transistor T11.

In the event of polarity reversal, that is, the application of oppositely oriented electrical potential gradient to the connecting terminals A and B, the circuit arrangement according to FIG. 4 operates in the following manner:

The electrical potential applied to the connecting terminal A is negative relative to that applied to the connecting terminal B, so that the Zener diodes D31 and D32 as switched in the electric current flow direction. Thus, practically the full voltage is applied to the voltage divider constituted by the resistors R30 and R21, this voltage then being divided in accordance with the voltage divider ratio to the lateral transistor T30 and the resistor R21. The resistor R34 causes the flow of an additional electrical current to the substrate, but this additional current can be held sufficiently small. The arrangement blocks even in the reverse-polarity case a similarly high voltage as in the correctpolarity case, in as much as the emitter-base diode of the transistor T21 is loadable considerably over the collector-base breakdown voltage of an npn transistor. In the layout (switching arrangement construction), the depression region of the resistors R21 and R30 is to be arranged in a potential-free manner. However, this requirement can be avoided by the arrangement of a diode between the connecting terminal A and the resistor R21.

Advantageously, the control arrangement ST is so laid out that it limits the current flowing through the transistors T10 and T11 to a value which is sufficient for the operation of the load resistor R2.

By using the switching circuit arrangement shown in FIG. 4, it is possible to control maximum pulse voltages of approximately 150 V which occur in an unprotected on-board network of a motor vehicle, by resorting to an economical and relatively inexpensive monolithically integrated technology.

Figure 5:
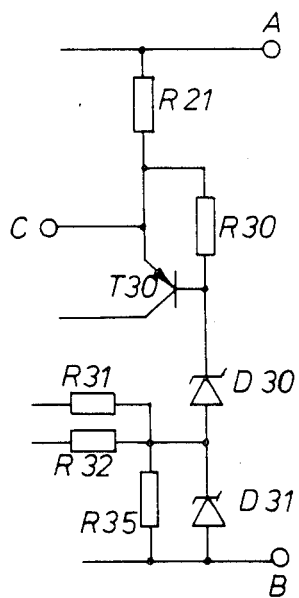
FIG. 5 is a partial view of a circuit arrangement that is modified with respect to the corresponding circuit arrangement depicted in FIG. 4.

The circuit portion depicted in FIG. 5 shows that it is possible to use, instead of the resistor R33 utilized in the arrangement illustrated in FIG. 4, a resistor 35 arranged in parallel to the Zener diode D31. In this embodiment of the present invention the transistors T31 and T32 are switched off simultaneously in response to a corresponding voltage increase.

It will be understood that each of the elements described above, or two or more together, may also find a useful application in other types of arrangements differing from the type described above.

While the invention has been illustrated and described as embodied in a switching circuit arrangement for an incadescent light bulb, it is not intended to be limited to the details shown, since various modifications and structural changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the claims.

What is claimed as new and desired to be protected by Letters Patent is set forth in the appended claims:

1. A monolithically integrated, polarity-reversal protected circuit for switching a resistive load on and off, comprising a transistor switching stage having an output; a symmetrical thyristor interposed in said output, including a vertical npn transistor and a lateral pnp transistor, and having a control input; control means connected to said control input and operative for controlling the switching of said thyristor between and the maintenance thereof in its conductive and nonconductive states; a first and a second connecting terminal, said first connecting terminal being at a positive potential with respect to said second terminal under normal circumstances; said transistor switching stage including at least one switching transistor having an emitter connected with said second terminal, a collector, and a base; and wherein said control means includes a pnp control transistor having an emitter connected with said control input, a collector connected with said collector of said at least one switching transistor, and a base, said control means further including at least one Zener diode connected in reverse direction with respect to said first connecting terminal between said base of said control transsistor and said emitter of said switching transistor, a resistor connected between said base of said control transistor and said control input, and a further resistor connected between said control input and said first connecting terminal.

2. The circuit as defined in claim 1, wherein said transistor switching stage includes an additional switching transistor connected with said switching transistor in a Darlington circuit arrangement and also having a respective emitter, collector and base; and wherein said control means further includes an additional Zener diode arranged in the reverse direction in series with said first mentioned Zener diode between said base of said control transistor and said second connecting terminal, two auxiliary transistors having respective collectors each connected with said base of one of said switching transistors, respective emitters connected to said second connecting terminal, and respective bases, said control means further including two base-control resistors each connected between the juncture of said Zener diodes and said base of one of said auxiliary transistors, and an additional resistor interposed between said second connecting terminal and one terminal of the respective base-control resistor.

* * * * *